United States Patent [19]

Stalley

[11] 4,037,203
[45] July 19, 1977

[54] HIGH SPEED DIGITAL INFORMATION STORAGE SYSTEM

[75] Inventor: Anthony Donald Stalley, Fleet, England

[73] Assignee: Quantel Limited, England

[21] Appl. No.: 608,082

[22] Filed: Aug. 27, 1975

[30] Foreign Application Priority Data

Sept. 3, 1974 United Kingdom ............... 38458/74

[51] Int. Cl.$^2$ .............................................. G06F 5/04
[52] U.S. Cl. ................................................. 364/900
[58] Field of Search ................ 340/172.5, 324 A, 173, 340/173 A; 445/1

[56] References Cited

U.S. PATENT DOCUMENTS

| 3,571,801 | 3/1971 | Coolidge et al. | 340/172.5 |
| 3,641,558 | 2/1972 | Cook et al. | 340/324 A |
| 3,685,039 | 8/1972 | Flanagan | 340/324 A |
| 3,731,278 | 5/1973 | Eldridge et al. | 340/172.5 |
| Re. 26,984 | 11/1970 | Hirvela | 340/172.5 |

Primary Examiner—Mark E. Nusbaum
Attorney, Agent, or Firm—Dowell & Dowell

[57] ABSTRACT

A high speed digital information storage system comprising means for providing $n$ successive samples of serial data on $n$ parallel paths coincident in time. Holding means are provided for holding the samples prior to storage. Storage means store the serial data samples and means are provided which skew and remultiplex the serial data at the output of the storage means when removed from the storage means. Clocking means provide clocking pulses to the holding means and the storage means in unison at one $n$th of the serial data rate.

6 Claims, 1 Drawing Figure

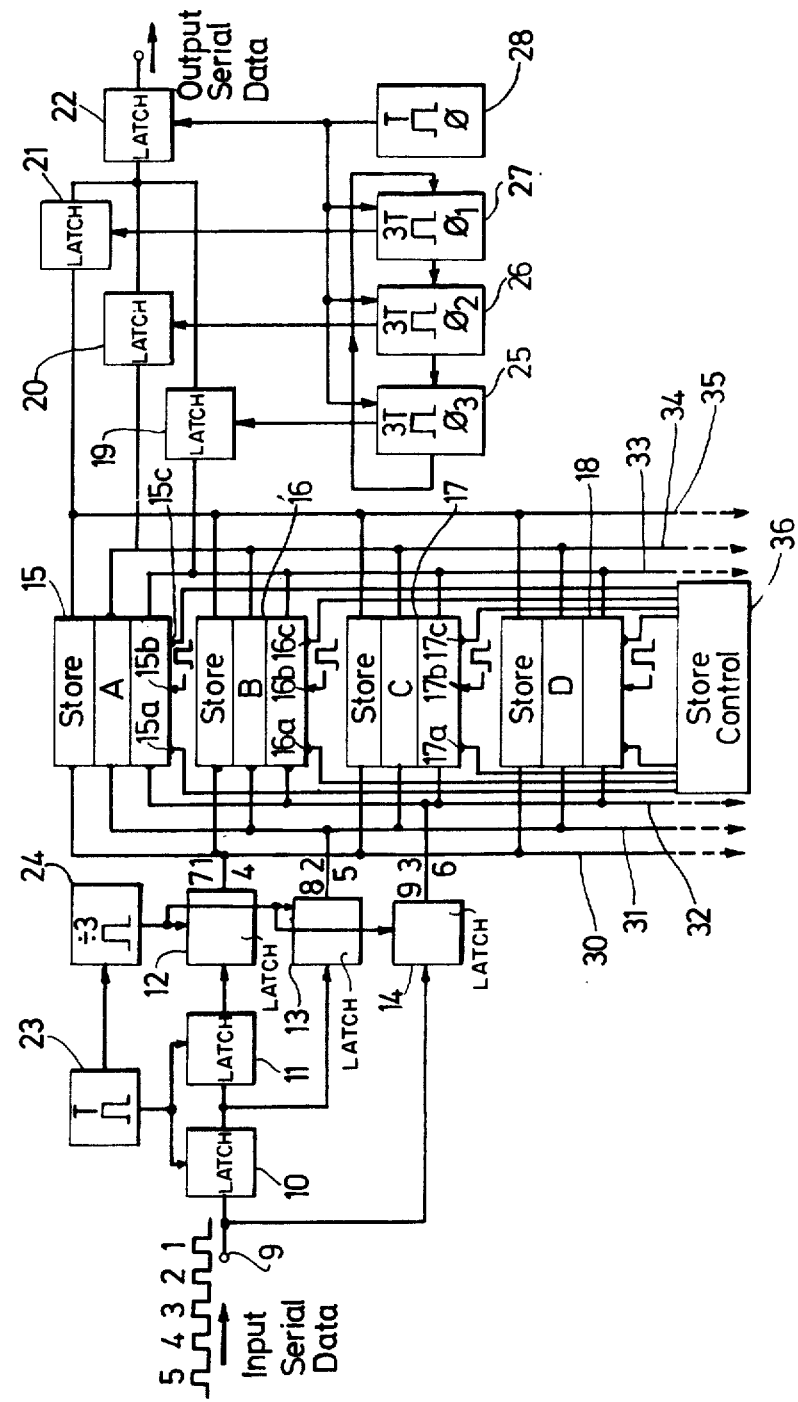

HIGH SPEED DIGITAL INFORMATION STORAGE SYSTEM

BACKGROUND OF THE INVENTION

This invention relates to the storage of high speed digital information and more particularly to processing of this information prior to storage so as to reduce the complexity of known storage systems.

When an analogue video signal for example is converted into digital form, it is commonly found that digital storage is used prior to reconversion of the signal to analogue form. Such conversion and storage is used for example in digital time base correctors (see for example U.S. Pat. Nos. 3,978,519 and 3,860,952). To control the flow of digital information into and out of storage devices, store clock pulses are needed. Suitable storage devices could comprise digital shift registers. The rate at which storage devices can handle data is limited and often falls short of the rate at which the video data is flowing. An example of this is in the processing of television signals where the information rate is much higher than the clock rate of available storage devices. A well established technique known as demultiplexing is used to effectively reduce the data rate by diverting information arriving serially to a number of parallel storage paths. If every piece of information is allocated to one of $n$ parallel storage paths, then the information rate seen by the storage devices is one $n$th of the incoming serial information rate. Each storage path must, therefore, be supplied with clock pulses at one $n$th of the input serial data rate but staggered in time one to another by periods equal to the period of the serial data. This implies $n$ phases of store clock pulses. In many television systems a multiplicity of storage devices may be used to provide the necessary store capacity, and the number of components needed to provide the multiple phases of clock drives becomes highly significant.

SUMMARY OF THE INVENTION

According to the invention we provide a high speed digital information storage system comprising means for providing $n$ successive samples of serial data on $n$ parallel paths coincident in time, holding means for holding said samples prior to storage, storage means to store said serial data samples, means to skew and remultiplex said serial data at the output of the storage means when removed from said storage means, and clocking means for providing clocking pulses to said holding means and said storage means in unison at one $n$th of the serial data rate.

The means for providing $n$ successive samples of serial data may be data latches (e.g. type Ser. No. 74174).

BRIEF DESCRIPTION OF THE DRAWING

An embodiment of the invention will now be described with reference to the accompanying drawing showing a schematic circuit of the storage including demultiplexing and remultiplexing means.

Demultiplexing comprises diverting consecutive data samples arriving serially on a single path to a number of parallel paths. However merely diverting the samples will result in consecutive data samples arriving sequentially and not simultaneously on the parallel paths. Such data is termed "skewed" data. The process whereby the consecutive data samples arrive simultaneously on the different paths is termed "de-skewing". The process whereby the consecutive samples again arrive sequentially on the paths is termed skewing (or re-skewing). The process whereby the data on the parallel paths is combined from the parallel paths to a single path is termed multiplexing (or remultiplexing).

In the embodiment shown in the drawing, the serial data is converted (demultiplexed) into three parallel data paths, but in order that these arrive at the stores coincidently, they must be deskewed. Consequently, after leaving the store, they must be skewed again and remultiplexed.

DESCRIPTION OF PREFERRED EMBODIMENT

Accordingly, the storage system comprises unit deskewing latches 10 and 11 and holding latches 12, 13 and 14, a parallel array of stores 15, 16, 17 and 18 to N (e.g. shift register type 1402); see for example Advanced Micro Devices Inc. Catalogue 1973). and output latches 19, 20, 21 and 22 (e.g. Ser. No. 74173). The lataches 10 and 11 are controlled by clock pulses from a generator 23 with a repetition period T and latches 12, 13 and 14 are controlled by a divider circuit 24 (e.g. 2 type Ser. No. 74574) which in the example shown provides pulses at an interval of one third the frequency of generator 23. The shift registers 15, 16, 17 and 18 each have inputs 15a, 15b, 15c; 16a, 16b, 16c, etc. for receiving input enabling, clocking and output enabling pulses respectively from a store control 36, the shift register (e.g. type 1402) and the control therefor being well known in the art. Sequencing waveforms suitable for the inputs and outputs of the stores may be derived from 2 4-bit ring counters. The latches 19, 20 and 21 are controlled respectively by ring counter circuit elements 25, 26 and 27, each of which has a frequency of one third T. The latch 22 is controlledbby a clock source 28 operating at a frequency of T. The demultiplexing factor $n$ in this example is taken as 3, although this factor could be any integer.

If the first piece of each group of N pieces of information is delayed by $(n-1)$ times the serial data period (I), the second piece by $(n-2)$ times the serial data period and so on, then every $n$ pieces of serial information will occur in parallel at the same instant.

By providing the additional $(n-1)$ latches (deskewing latches 10 and 11), the deskewed data enters latches 12, 13 and 14 which are clocked in unison with whichever of the stores 15, 16, 17 and 18 is active.

Each of the stores comprises $n$ parallel paths consisting of identical lengths of shift registers. In this example where $n$ equals three, each store is shown having three separate inputs and outputs. Any number of stores 15, 16, 17, 18 etc., each having $n$ integral paths can be connected with their inputs and outputs in common to highways 30 31, 32 and 33, 34, 35 respectively. This arrangement allows blocks of input data (one horizontal scan duration of the television waveform is a convenient period) to be written into individual stores each of which has a capacity less than the total storage capacity required.

The serial data 1, 2, 3, 4 etc. arriving at input 9 is deskewed by the latches 10, 11 and held by the latches 12, 13, 14 to allow sufficient time for the data to be captured by the store. In this example the serial data at the output of the latches appears in parallel groups of three, 1,2,3; 4,5,6; 7,8,9; etc. as shown. By means of the store control 36, the inputs of the first store 15 are enabled and the data is clocked in to this store until completely full whereafter the inputs of the next store 16 are enabled and the data clocked into that store until full. Each successive store if filled with data representing a television line (i.e. one line per store) until data has been written into all of the stores. The data representing the next television line can then be written into the first store once again.

The data is read from each store when required and its enabled ouput is fed via the common highways 33, 34, 35 to the skewing and multiplexing latches 19, 20, 21 and 22. The data appearing at the enabled outputs in parallel form is latched in sequence by the latches 29, 20, 21. The latch 22 operates on every clocking operation of the latches 19, 20, 21 and therefore provides a serial data output. During the writing and reading operations of each active store, the inputs and outputs of the quiescent stores are disabled.

Provided that the stores are selected one at a time for writing or for reading, then the demultiplexing (deskewing) and remultiplexing (reskewing) circuits can be shared between a number of stores. Further more, other than providing clocking at data frequency and at $1/n$th data frequency multi-phased clocking is avoided.

The arrangement shown in the drawing only shows the handling of digital words of 1 bit, but it will be appreciated that for words of more than 1 bit a similar arrangement of latches and stores will be required for each bit of the digital word. Thus, for serial data samples each of 8 bit parallel word form, 8 such circuits would be provided. Thus for samples of 8 bits instead of the three register paths for Store A for example as shown 24 shift register stores could be provided capable of receiving parallel coded input signals, the register stores being clocked together.

I claim:
1. A high speed digital information storage system comprising:-
   a. converter means for receiving successive samples of incoming serial data on a single path and for providing $n$ successive samples of the serial data on $n$ parallel paths coincident in time;
   b. holding means connected to said converter means for holding the $n$ successive samples on said parallel paths for a period $n$ times greater than the data repetition period to effectively reduce the data rate prior to storage;
   c. storage means connected to said holding means for storing the serial data held in said holding means;
   d. clocking means connected to said holding and storage means for clocking in unison said holding means and said storage means at one $n$th of the serial data rate;
   e. skewing means connected to said storage means for sequentially holding $n$ coincident data samples on $n$ parallel paths read out from the storage means; and
   f. remultiplexing means connected to said skewing means for receiving the $n$ successive samples from the skewing means and for providing the successive samples on a single path.

2. A storage system according to calim 1 wherein said converter means includes $n - 1$ series connected latches clocked at the incoming serial data rate.

3. A storage system according to claim 2 wherein said holding means comprises a parallel array of $n$ latches each having a clocking input coupled to receive simultaneous clock pulses from said clocking means, the input of the first latch of said parallel array being connected to the output of the $n$th series connected latch of said converter means, the inputs of the succeeding parallel latches except the $n$th being connected respectively between the preceding series latches of said converter means, and the $n$th latch being connected to receive the incoming serial data directly.

4. A storage system according to claim 1 wherein said storage means comprises a plurality of stores each having $n$ parallel paths consisting of identical lengths of shift registers.

5. A storage system according to claim 4, in which clocking means are provided for respectively enabling the inputs, writing in and reading out the data, and enabling the outputs.

6. A storage system according to claim 7 wherein said skewing means comprises $n$ latches each on one of $n$ parallel paths, which latches are clocked in sequence at one $n$th of the serial data rate and said remultiplexing means comprises a latch connected to the $n$ skewing latches and clocked at a rate equal to the incoming data rate.

* * * * *